(12) United States Patent
Bollig et al.

(10) Patent No.: US 6,661,074 B2
(45) Date of Patent: Dec. 9, 2003

(54) RECEIVER COMPRISING A VARIABLE CAPACITANCE DIODE

(75) Inventors: Bernhard Bollig, Pinneberg (DE); Hans Martin Ritter, Nahe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/070,122

(22) PCT Filed: Jul. 4, 2001

(86) PCT No.: PCT/EP01/07686

§ 371 (c)(1),
(2), (4) Date: Mar. 1, 2002

(87) PCT Pub. No.: WO02/07222

PCT Pub. Date: Jan. 24, 2002

(65) Prior Publication Data

US 2002/0121672 A1 Sep. 5, 2002

(30) Foreign Application Priority Data

Jul. 6, 2000  (DE) ............................................. 10032389

(51) Int. Cl.[7] ............................................. H01L 29/93
(52) U.S. Cl. ........................ 257/480; 257/312; 257/595; 257/46; 257/596
(58) Field of Search ................................. 257/312, 480, 257/596, 46, 359, 503, 597, 600, 605, 544, 545, 546, 577, 533, 362, 598, 595, 601; 438/379, 570

(56) References Cited

U.S. PATENT DOCUMENTS

| 3,590,340 A | * | 6/1971 | Kubo et al. | .................. 257/363 |
| 4,691,224 A | * | 9/1987 | Takada | ........................ 257/495 |
| 4,777,518 A | * | 10/1988 | Mihara et al. | ............... 257/363 |

FOREIGN PATENT DOCUMENTS

DE    3943013    6/1990    ........... H01L/25/00

* cited by examiner

*Primary Examiner*—Eddie Lee
*Assistant Examiner*—Matthew C. Landau
(74) *Attorney, Agent, or Firm*—Steven R. Biren

(57) ABSTRACT

A receiver for radio or television signals provided with a high-frequency circuit having a discrete semiconductor component which includes a planar variable capacitance diode and an integrated series resistor formed on a common semiconductor or substrate. The receiver has lower parasitic capacitance and improved data reception, resulting in an increase of the Q factor of the variable capacitance diode and an increase in the circuit performance. The overall circuit loss is also reduced.

9 Claims, 2 Drawing Sheets

RECEIVER COMPRISING A VARIABLE CAPACITANCE DIODE

The invention relates to a receiver for radio or television signals, which is provided with a high-frequency circuit comprising a discrete semiconductor component which includes a planar variable capacitance diode and an integrated series resistor on a common semiconductor substrate.

The signals emitted by a transmitter as electromagnetic high-frequency waves are received by a receiver for radio or television signals, which signals are converted by the reception antenna into high-frequency alternating voltages. A receiver separates a desired transmitter from undesired transmitters (tuning), recovers the transferred information from the modulated high-frequency oscillations (demodulation) and converts the low-frequency signals into acoustic and optical signals by means of a low-frequency amplifier.

In state-of-the-art receivers for radio or television signals, all tuning and band-switching operations are carried out electronically. For this purpose, use is made of high-frequency circuits with resonant circuits wherein variable capacitance diodes operate as variable capacitors. The tuning precision is higher as the number of tuning circuits in the receiver is larger.

The high-frequency circuits for a radio or television signal receiver may be composed of discrete components. When these discrete components are connected to leads, however, problems with the stray capacitances of the leads occur, which may have a negative effect on the tuning properties of the receiver. In order to circumvent these problems, it is disclosed in DE 39 43 013 C2 to provide a television tuner with an input stage comprising a diode consisting of a semiconductor substrate (N) and a semiconductor region (P) having opposite conductivity types, the semiconductor region being inserted into the substrate, and a resistor arranged on the substrate (N) above an insulating layer, which resistor contacts the substrate via an opening formed in the insulating layer and serves to protect the diode against excess voltages, and first and second connection elements connected to the terminals of the diode, a third connection element connected to the resistor, and a resin packing wherein the diode, the resistor and the connection elements are cast and fixed.

As a receiver for radio or television signals should convert the high-frequency input signals, which are error-ridden as a result of superimposed noise, into an error-free data stream, it is desirable that parasitic capacitances in the receiver are precluded as much as possible.

Therefore, it is an object of the invention to provide a radio or television signal receiver with reduced parasitic capacitances and an improved data reception.

In accordance with the invention, this object is achieved by a receiver for radio or television signals provided with a high-frequency circuit comprising a discrete semiconductor component, which includes a planar variable capacitance diode formed on a semiconductor substrate 4 of a first doping type with a first doping density n1, on which semiconductor substrate an epitaxial layer 3 of the same doping type with a second doping density n2>n1 is provided, on which epitaxial layer an insulation layer 5 having a first window is provided by means of a first laterally bounded semiconductor region 2 of a second doping type with a doping density n3>n2 in the epitaxial layer below the first window, and a first contact pad 6 which contacts the first laterally bounded semiconductor region via the first window, which semiconductor component further includes an integrated series resistor composed of a resistor path 8 which comprises two path ends on the insulation layer, the first path end being in contact, through a second window in the insulation layer, with a third laterally bounded semiconductor region 9 of the first doping type with a doping density n5>n2, which extends, in the vertical direction, at least through the epitaxial layer, which resistor path further comprises a second contact pad 7, which is arranged on the insulation layer and contacts the second path end of the resistor path, and a second laterally bounded semiconductor region 1 in the epitaxial layer, below the second contact pad and the resistor path, said semiconductor region having a doping of the second doping type with a doping density n4, which substantially compensates for the doping of the first doping type with a doping density n2 of the epitaxial layer.

By providing the epitaxial layer with an additional doping below the second contact pad and the resistor path, the parasitic capacitances are reduced at said location. A reduction of the parasitic capacitance results in an increase of the Q factor of the variable capacitance diode and hence also an increase of the circuit performance. The overall circuit loss is reduced.

The invention also relates to a discrete semiconductor component which comprises a planar variable capacitance diode formed on a semiconductor substrate of a first doping type with a first doping density n1, on which semiconductor substrate an epitaxial layer of the same doping type with a second doping density n2>n1 is provided, on which epitaxial layer an insulation layer having a first window is provided by means of a first laterally bounded semiconductor region of a second doping type with a doping density n3>n2 in the epitaxial layer below the first window, and a first contact pad which contacts the first laterally bounded semiconductor region via the first window, which semiconductor component further comprises an integrated series resistor composed of a resistor path having two path ends on the insulation layer, the first path end being in contact, through a second window in the insulation layer, with a third laterally bounded semiconductor region of the first doping type with a doping density n5>n2, which extends, in the vertical direction, at least through the epitaxial layer, which resistor path further comprises a second contact pad, which is arranged on the insulation layer and contacts the second path end of the resistor path, and a second laterally bounded semiconductor region in the epitaxial layer, below the second contact pad and the resistor path, said semiconductor region having a doping of the second doping type with a doping density n4, which substantially compensates for the doping of the first doping type with a doping density n2 of the epitaxial layer.

A reduction of the parasitic capacitances results in a reduction of the associated substrate losses and RC propagation delays. This is advantageous, particularly at high frequencies occurring, for example, in cordless RF communication applications and digital high-velocity applications.

Within the scope of the invention it may be preferred that the sum of the charge carrier concentration n4 and n2 is below $10^{16}/cm^3$.

Particularly advantageously, the second laterally bounded semiconductor region extends across the entire thickness of the epitaxial layer.

It may also be preferred for the doping density n4 of the second laterally bounded semiconductor region to decrease from the boundary surface to the insulation layer to the boundary surface to the substrate.

In accordance with a further preferred embodiment of the invention, the semiconductor substrate comprises a rear-side metallization.

In accordance with a particularly preferred embodiment of the invention, the discrete semiconductor component is accommodated in a standardized transistor housing having three connections. The signal paths in the accommodated semiconductor component are short, thus rendering it particularly suitable for use in the high-frequency range. In comparison with the prior art, the process and manufacturing costs of the receiver comprising a semiconductor component with a standardized housing are reduced, which can be attributed to the small surface space required and to a smaller number of loading operations.

These and other aspects of the invention will be apparent from and elucidated with reference to the embodiment(s) described hereinafter.

Receivers for radio or television signals customarily operate in accordance with the superposition principle, i.e. the various, high input frequencies are first converted to the same intermediate frequency band or are mixed to a lower frequency before being subjected to further processing. The embodiment of the high-frequency input part (tuner) necessary for this purpose is identical for radio receivers, black-and-white television receivers and color receivers.

In the high-frequency input part, the receiver is tuned to the desired transmitter frequency. Input circuits and/or intermediate band filters are used to filter the desired channel with the required bandwidth from the frequency spectrum at the input. Mixer stages subsequently convert the filtered-out incoming frequencies to the intermediate frequency range.

The high-frequency input part of a receiver for radio or television signals is composed of a number of high-frequency circuits consisting of a plurality of assemblies. Some of the assemblies are loaded not only with tuning coils, field effect transistors, blocking capacitors and by-pas capacitors, protective resistors, etc., but also with variable capacitance diodes which are used for tuning resonant circuits, low-noise amplification of high-frequency signals and frequency and amplitude modulation.

The barrier layer capacitance of variable capacitance diodes varies with the reverse voltage. They can thus be employed in a resonant circuit for tuning the resonant frequency. The integrated series resistor is used for the high-impedance supply of the tuning voltage. Variable capacitance diodes are used, in particular, for the high-frequency input stage of the receiver, which receiver comprises resonant circuits for station selection and for automatic tuning.

Figure 1:
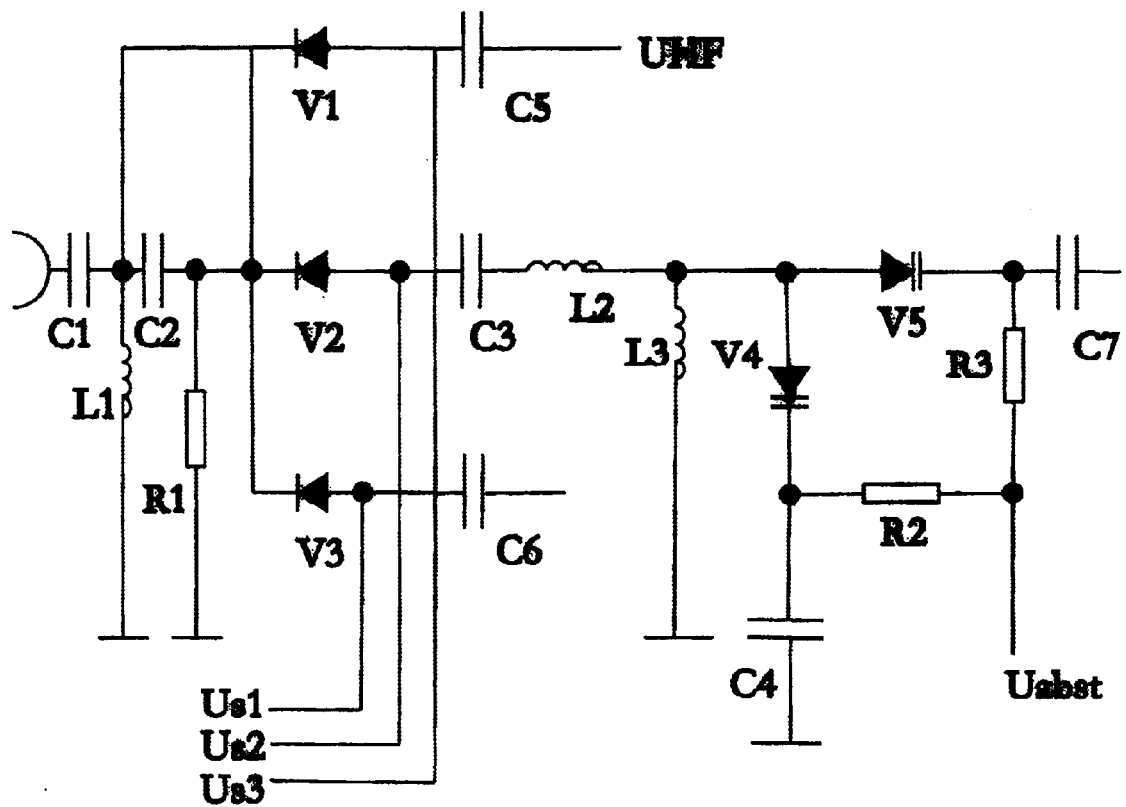
FIG. 1 shows the high-frequency circuit for a receiver two-way splitter.

In accordance with an embodiment of the invention, the receiver for radio and television signals comprises a receiver two-way splitter with a high-frequency circuit in accordance with FIG. 1, comprising two discrete components with a variable capacitance diode V4, V5 with an integrated series resistor R2, R3. A tuned input circuit suppresses signals with the image frequency and precludes intermodulation.

The antenna signal is led to the junction point of the switching diodes V1, V2, V3 via a high-pass filter. In order to receive a certain channel, for example, the switching voltage Us3 is used for low-impedance switching of the signal path via the diode V2, the diodes V1 and V2 being in the blocking mode. The series resonant circuit C3L2 with a resonance frequency of, for example, 202 MHz transmits the very high frequency range III, the parallel resonant circuit L3V4C4 being used for the channel-wise selection of the frequency range. This tuned parallel resonant circuit attenuates the image-frequency voltage and precludes intermodulation. The variable capacitance diode V5 is tuned in conjunction with V4 and reduces the influence of the input capacitance of a small-signal transistor on the parallel resonant circuit. By virtue thereof, the bandwidth and the tuning precision of the parallel resonant circuit remain constant throughout the tuning range.

Particularly at the high frequencies in the VHF range, it is thus precluded that too much of the high-frequency power is coupled out via the impedance of the parasitic capacitance at the resistors R2 and R3.

The variable capacitance diodes, which are currentless, except for the residual current in the nA range, are biased via the high-impedance series resistors. The series resistors are designed such that the desired frequency range between $f_{min}$ and $f_{max}$ is covered.

Figure 2:
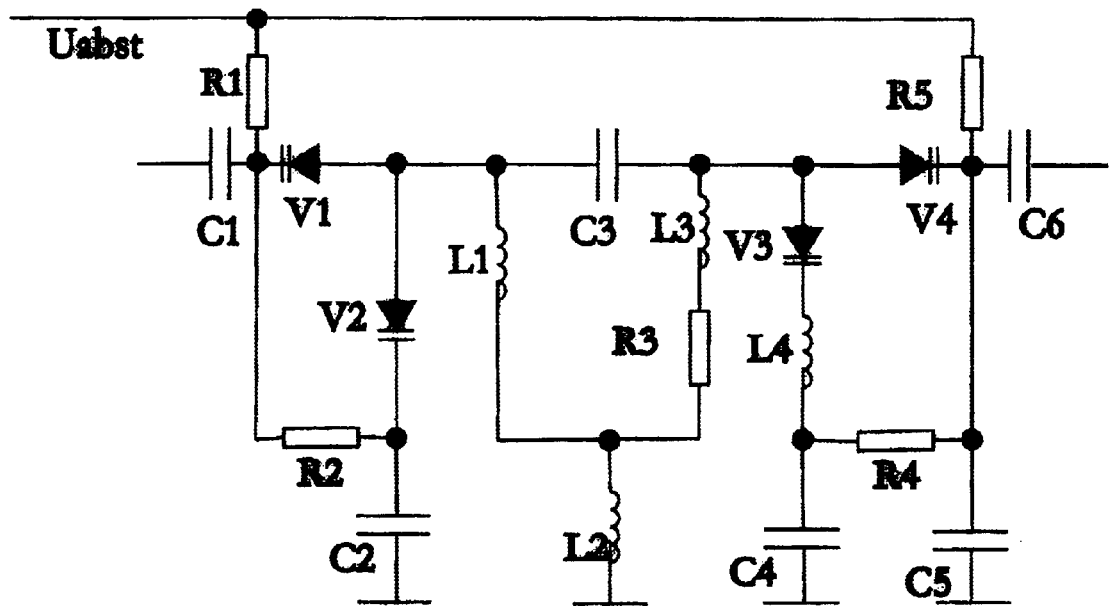
FIG. 2 shows the high-frequency circuit for an intermediate band filter.

In accordance with a further embodiment of the invention, the receiver for radio and television signals comprises an intermediate band filter, as shown in FIG. 2, which is tuned to the receiving channels by means of the variable capacitance diodes V1, V2, V3 and V4.

Figure 3:
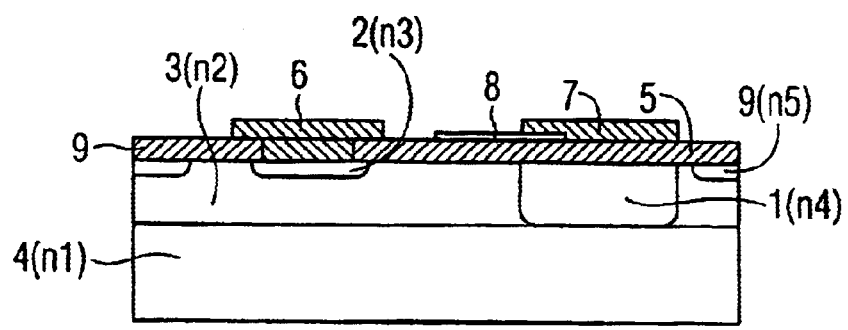
FIG. 3 is a cross-sectional view of a discrete semiconductor component comprising a planar variable capacitance diode and an integrated series resistor.
Figure 4:
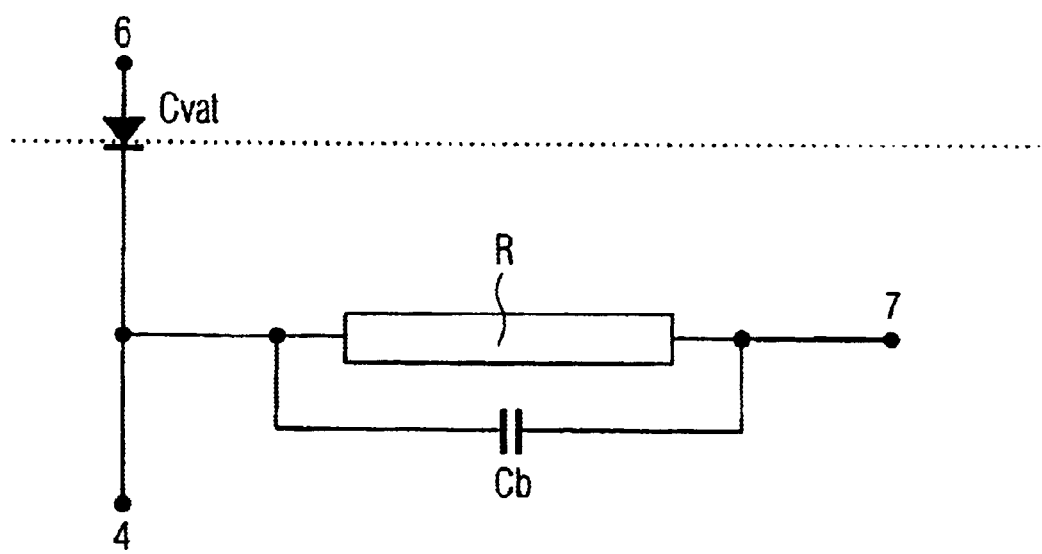
FIG. 4 shows the equivalent circuit diagram of a discrete semiconductor component as shown in FIG. 3.

FIG. 3 is a cross-sectional view of the layout of a variable capacitance diode in accordance with the invention comprising an integrated series resistor.

The diode in accordance with the invention is a variable capacitance diode. Said variable capacitance diode is a junction diode which is comprised of a pn-junction and is operated in the non-conducting direction. Variable capacitance diodes having a high capacitance variation and a high reverse voltage are obtained by means of high-impedance epitaxial n-layers, and variable capacitance diodes having a small path resistance and high Q factors are obtained by means of low-impedance epitaxial n-layers.

The semiconductor substrate is composed of a heavily doped silicon chip 4 of a first doping type having a doping density n1. Said doping type may either be the N-doping type or the P-doping type, but the N-type is preferred. A typical N-dopant is formed by phosphor ions ($P^+$). An alternative N-dopant is arsenic ($As^+$), which is preferably used for the substrate of the variable capacitance diode owing to its higher solubility. The substrate serves as a low-impedance lead for the epitaxial layer 3 deposited thereon.

A more lightly doped epitaxial layer 3 of the same doping type having a second doping density n2<n1 is provided on the semiconductor substrate. The thickness and the doping of the epitaxial layer is governed by the necessary reverse voltage and capacitance of the variable capacitance diode. The epitaxial layer of variable capacitance diodes is typically lightly doped, i.e. of the order of $10^{16}$ $cm^{-3}$. As a result, said epitaxial layer has a high specific resistance. Therefore, the thickness of the epitaxial layer 3 is chosen to be as small as possible, i.e. in the range from 1 $\mu$m to 10 $\mu$m.

An insulation layer 5 having a first window is provided on the epitaxial layer. For the insulation layer use is made of an approximately 0.5 to 1.5 $\mu$m thick $SiO_2$ layer, which can be produced by means of thermal oxidation of the silicon surface. A first contact pad 6 covers the first window. Said contact pad forms the anodic contact of the variable capacitance diode.

A trough-shaped, laterally bounded semiconductor region 2 of a second doping type with a third doping density n3 in the epitaxial layer, said doping density being higher than the second doping density n2, forms the variable capacitance diode. In the window, said variable capacitance diode adjoins the first contact pad. The conductivity type of the trough-shaped semiconductor region is in opposition to the conductivity type of the substrate. For example, this region is n-conducting if the substrate is p-conducting. If the substrate is n-conducting, the doped region is p-conducting, which is typically achieved using the P-dopant boron.

The variable capacitance diode's contact with the cathode is improved by heavily doping the substrate layer and a rear side metallization.

The insulation layer is further provided with a resistor path 8 for the integrated series resistor. The series resistor is preferably made from lightly doped polysilicon. Lightly doped polysilicon forms high-impedance resistors in the M$\Omega$/☐ range and requires only a small surface area. At one end, the resistor path is connected, via the insulation frame 9, to the cathode of the variable capacitance diode or, via the first contact pad 6, to the anode of the variable capacitance diode. At the other end, the resistor path is connected, with the second contact pad 7, to an external connection via connection pins or the like.

A second laterally bounded semiconductor region 1 extends in the epitaxial layer below the second contact pad 7 and the resistor path 8. In addition to the doping of the first doping type with a doping density n2, said semiconductor region is provided with a doping of a second doping type with a doping density n4. The second, laterally bounded semiconductor region is formed by means of a dopant, which leads to a conductivity type that is in opposition to that of the first doping of the epitaxial layer. In this manner, a very small density of the free charge carriers is achieved in the second laterally bounded semiconductor region, as a result of which parasitic capacitances between the contact pad, the substrate and the variable capacitance diode are precluded.

Advantageously, the second laterally bounded semiconductor region is embodied so as to be as deep as possible. Said semiconductor region should have a uniform doping concentration and a gradual junction region to the substrate.

The semiconductor component is bounded by an insulation frame 9 (channel stopper), which extends vertically through the epitaxial layer. Said insulation frame may also extend downwards as far as the substrate. The insulation frame is formed by a trough-shaped, laterally bounded semiconductor region 9 of a first doping type with a third doping density n5, which is higher than the second doping density n2 of the epitaxial layer.

The planar variable capacitance diode with an integrated resistor is manufactured using planar technology. In this method, the required pn-junctions are produced, from the surface, in a number of successive steps by specific diffusion into the semiconductor substrate or into an epitaxial layer. For the starting material use is generally made of the inexpensive silicon or, at very high frequencies, use is alternatively made of gallium arsenide.

For example, there is started from an n-conducting silicon single crystal disc as the substrate. The heavily doped substrate has a layer thickness of several hundred $\mu$m and also serves as a mechanical support. As the indiffused, laterally bounded semiconductor region of the variable capacitance diode is flat compared to the thickness of the substrate, use is advantageously made of an n-doped substrate. This enables, owing to the higher electron mobility, a path resistance to be achieved which is smaller than that of a p-substrate.

For the epitaxial layer, an n-doped heteroepitaxial silicon layer is provided on the silicon surface. In a next step, the entire surface of the silicon disc is oxidized at a temperature around 1000° C. in a stream of oxygen or by means of water vapor so as to form an insulation layer of $SiO_2$. Subsequently, the photolithographic structure definition takes place. In the insulation layer, windows are etched above the two laterally bounded semiconductor regions in the epitaxial layer by means of a photolithographic process and a subsequent etching operation. Depending on the mask artwork, a positive or negative resist application process can be used. The pattern transfer in the $SiO_2$ layer takes place by means of a wet or dry chemical etching process. Subsequently, the remaining resist layer is removed.

Acceptor or donor substances, for example boron in the case of an n-conducting silicon substrate and phosphor in the case of a p-conducting silicon substrate are indiffused via the windows, said acceptor or donor substances yielding p-conducting or n-conducting laterally bounded semiconductor regions having a pn-junction towards the starting material.

To manufacture the laterally bounded semiconductor region below the resistor path, use is made of a diffusion process. Various process variants are known. It is alternatively possible, in particular, to choose a combined process comprising ion implantation and diffusion. The dopants penetrate the epitaxial layer through the window, or if the implantation energy is sufficiently high, also through the thin silicon oxide insulation layer. Said epitaxial layer is converted, to a depth of a few micrometers, into a p-conducting region or an n-conducting region.

To obtain a uniform doping profile, the doped layer is formed by means of ion implantation. For example, the doped region is formed by means of a method comprising the implantation of phosphor ions with an implantation energy in a range from 10 keV to 500 keV and a dose in the range from approximately $10^{12}$ to $10^{16}$ ions per cm$^2$.

If the compensation doping for the second laterally bounded semiconductor region is carried out through a window, then this window is closed again by thermal oxidation in a stream of oxygen or hydrogen, or by deposition of a silicon oxide layer of TEOS or PYROX. A new window for the laterally bounded semiconductor region for the variable capacitance diode is etched in the closed insulation layer by means of photolithography. In the subsequent production steps, the doping profiles are indiffused through this window. In order to influence the doping profile and hence the capacitance-voltage curve, use is made of multiple diffusion, profile epitaxy and multiple ion implantation. The variable capacitance diode comprises a flat, yet heavily doped, p-doped, laterally bounded semiconductor region, which can also be formed by outdiffusion of p-doped polysilicon.

The complexity of the manufacturing process can be reduced by combining the formation of the laterally bounded semiconductor region below the second contact pad 7 with the implantation operation for the variable capacitance diode.

Subsequently, the whole is oxidized again in a stream of oxygen until the entire surface is covered again with the protective oxide layer. It is alternatively possible to provide the surface with an insulating silicon oxide layer by deposition of TEOS or PYROX.

In a new lithographic phase, the doping regions of the insulation frame are manufactured.

The resistor path for the integrated series resistor is provided on the insulating layer. Preferably, the resistor path is manufactured from lightly doped polysilicon, which is etched so as to obtain specific length dimensions and cross-sectional areas to obtain the desired resistance value. Polysilicon layers can be pyrolytically manufactured from silane $SiH_4$ by means of CVD processes and plasma-enhanced CVD processes.

Subsequently, the window for the first contact pad 6 is formed by etching. Next, aluminum is vapor deposited onto the entire surface, said aluminum forming an alloy in the window with the subjacent regions. As a result, a metal, barrier layer-free connector contact is obtained.

In a last photo and etching process, any excess aluminum is removed as far as the two contact pads and the conductor tracks to the external connections.

The cathode connection is embodied so as to extend throughout the rear side of the substrate. The substrate itself may form the cathode connection. Preferably, for the cathode connection a rear side metallization is applied to the lower side of the substrate.

At the end of the planar process, the semiconductor wafers are sawn resulting in individual discrete semiconductor components.

The discrete semiconductor component is mounted on a holder by gluing or alloying, which holder will form a part of the housing at a later stage. Subsequently, the electric contacts for external connections are formed in that metallic conductor tracks starting from the contact pad of the semiconductor component are enlarged so as to form bonding spots on which the connection wires issuing to the exterior can be attached.

The bonded structure may further be provided with a synthetic resin and, for example, is accommodated in a TO or SOT package.

The semiconductor device comprising a planar variable capacitance diode with an integrated series resistor cannot only be used in the input stage of receivers of television and radio signals but also as a voltage-controlled, variable capacitor. Examples include circuits for amplitude modulation, circuits for voltage-controlled oscillations (VCO), frequency synthesizers and Phase-Locked-Looped circuits for mobile telephones.

What is claimed is:

1. A receiver for radio or television signals provided with a high-frequency circuit comprising a discrete semiconductor component, which includes a planar variable capacitance diode formed on a semiconductor substrate of a first doping type with a first doping density n1, on which semiconductor substrate an epitaxial layer of the same doping type with a second doping density n2>n1 is provided, on which epitaxial layer an insulation layer having a first window is provided, and a first laterally bounded semiconductor region of a second doping type with a doping density n3>n2 in the epitaxial layer is provided below the first window, and a first contact pad which contacts the first laterally bounded semiconductor region via the first window, which semiconductor component further includes an integrated series resistor composed of a resistor path on the insulation layer, and a second contact pad, which is arranged on the insulation layer and contacts the resistor path, and a second laterally bounded semiconductor region in the epitaxial layer, below the second-contact pad and the resistor path, said second laterally bounded semiconductor region extending across an entire thickness of the epitaxial layer and having a doping of the second doping type with a doping density n4, which substantially compensates for the doping of the first doping type with a doping density n2 of the epitaxial layer.

2. A discrete semiconductor component, which comprises a planar variable capacitance diode formed on a semiconductor substrate of a first doping type with a first doping density n1, on which semiconductor substrate an epitaxial layer of the same doping type with a second doping density n2>n1 is provided, on which epitaxial layer an insulation layer having a first window is provided, and a first laterally bounded semiconductor region of a second doping type with a doping density n3>n2 in the epitaxial layer is provided below the first window, and a first contact pad which contacts the first laterally bounded semiconductor region via the first window, which semiconductor component further includes an integrated series resistor composed of a resistor path on the insulation layer, and a second contact pad, which is arranged on the insulation layer and contacts the resistor path, and a second laterally bounded semiconductor region in the epitaxial layer, below the second contact pad and the resistor path, said second laterally bounded semiconductor region having a doping of the second doping type with a doping density n4, which substantially compensates for the doping of the first doping type with a doping density n2 of the epitaxial layer, wherein a sum of the charge earner concentrations n4 and n2 is below $10^{16/cm^3}$.

3. A discrete semiconductor component as claimed in claim 2, characterized in that the doping density n4 of the second laterally bounded semiconductor region decreases from a boundary surface to the insulation layer to the boundary surface to the substrate.

4. A discrete semiconductor component as claimed in claim 2, characterized in that the semiconductor substrate comprises a rear-side metallization.

5. A discrete semiconductor component as claimed in claim 2, characterized in that it is accommodated in a standardized transistor housing having three connections.

6. A discrete semiconductor component, which comprises a planar variable capacitance diode formed on a semiconductor substrate of a first doping type with a first doping density n1, on which semiconductor substrate an epitaxial layer of the same doping type with a second doping density n2>n1 is provided, on which epitaxial layer an insulation layer having a first window is provided, and a first laterally bounded semiconductor region of a second doping type with a doping density n3>n2 in the epitaxial layer is provided below the first window, and a first contact pad which contacts the first laterally bounded semiconductor region via the first window, which semiconductor component further includes an integrated series resistor composed of a resistor path on the insulation layer, and a second contact pad, which is arranged on the insulation layer and contacts the resistor path, and a second laterally bounded semiconductor region in the epitaxial layer and extending across an entire thickness of the epitaxial layer, below the second-contact pad and the resistor path, said second laterally bounded semiconductor region having a doping of the second doping type with a doping density n4, which substantially compensates for the doping of the first doping type with a doping density n2 of the epitaxial layer.

7. A discrete semiconductor component as claimed in claim 6, characterized in that the doping density n4 of the second laterally bounded semiconductor region decreases from a boundary surface to the insulation layer to the boundary surface to the substrate.

8. A discrete semiconductor component as claimed in claim 6, characterized in that the semiconductor substrate comprises a rear-side metallization.

9. A discrete semiconductor component as claimed in claim 6, characterized in that it is accommodated in a standardized transistor housing having three connections.

* * * * *